United States Patent [19]
Hwu et al.

[11] Patent Number: 5,926,615
[45] Date of Patent: Jul. 20, 1999

[54] TEMPERATURE COMPENSATION METHOD FOR SEMICONDUCTOR WAFERS IN RAPID THERMAL PROCESSOR USING SEPARATED HEAT CONDUCTING RINGS AS SUSCEPTORS

[75] Inventors: Jenn-Gwo Hwu; Kuo-Chung Lee; Hong-Yuan Chang, all of Taipei, Taiwan

[73] Assignee: National Science Council, Taipei, Taiwan

[21] Appl. No.: 08/889,733

[22] Filed: Jul. 8, 1997

[51] Int. Cl.[6] ................................ F26B 3/30; A21B 1/00; A01K 15/04
[52] U.S. Cl. .......................... 392/418; 219/405; 219/411; 118/724; 118/728; 118/730
[58] Field of Search ...................................... 392/418, 390, 392/416; 219/391, 392, 405, 407, 408, 411; 118/725, 724, 728, 730

[56] References Cited

U.S. PATENT DOCUMENTS

| 5,444,217 | 8/1995 | Moore | 219/408 |
| 5,517,594 | 5/1996 | Shah | 219/405 |
| 5,715,361 | 2/1998 | Moslehi | 219/405 |

Primary Examiner—Teresa Walberg
Assistant Examiner—Daniel Robinson
Attorney, Agent, or Firm—Hitt Chwang & Gaines, P.C.

[57] ABSTRACT

The "Temperature compensation method for semiconductor wafers in rapid thermal processor using properly designed heat conducting pads as susceptors" is a new temperature compensation concept suitable for rapid thermal processor without uniform temperature distributions. By proper design of heat conducting pads, one can make the semiconductor wafers have uniform temperature distribution in a non-uniform heated rapid thermal processor. This is a very simple and cheap method for solving the temperature non-uniformity problem in the rapid thermal processor.

4 Claims, 8 Drawing Sheets

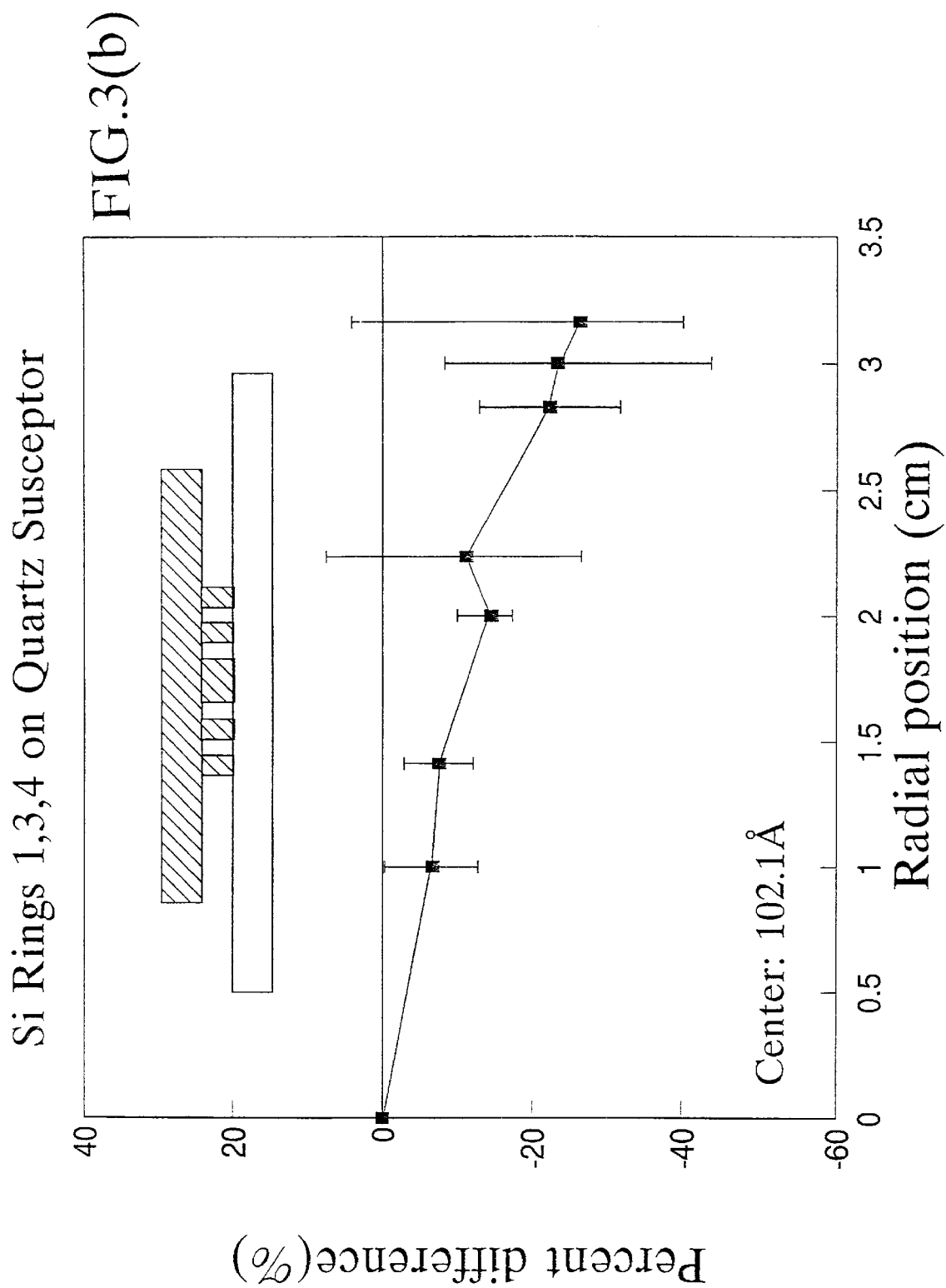

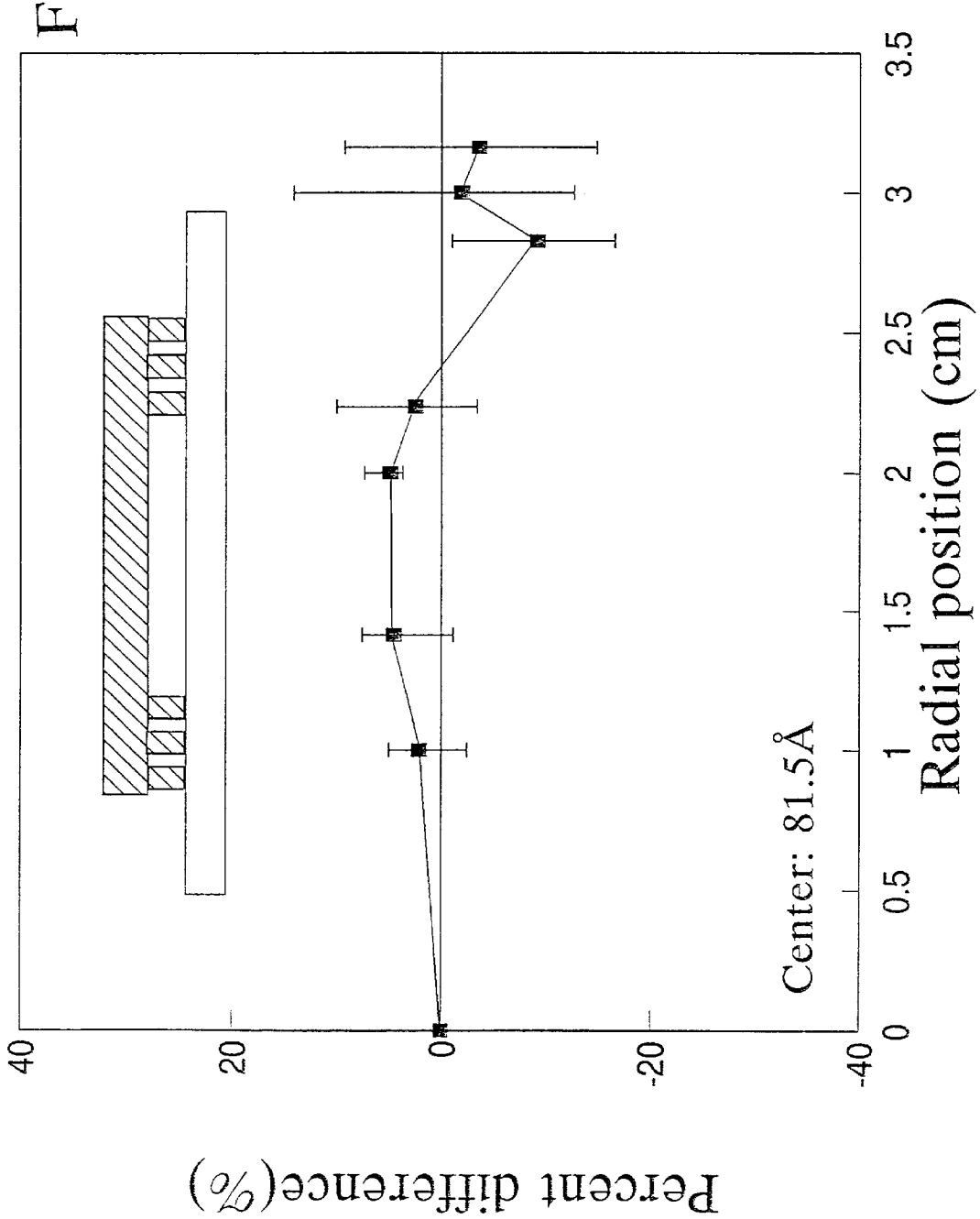

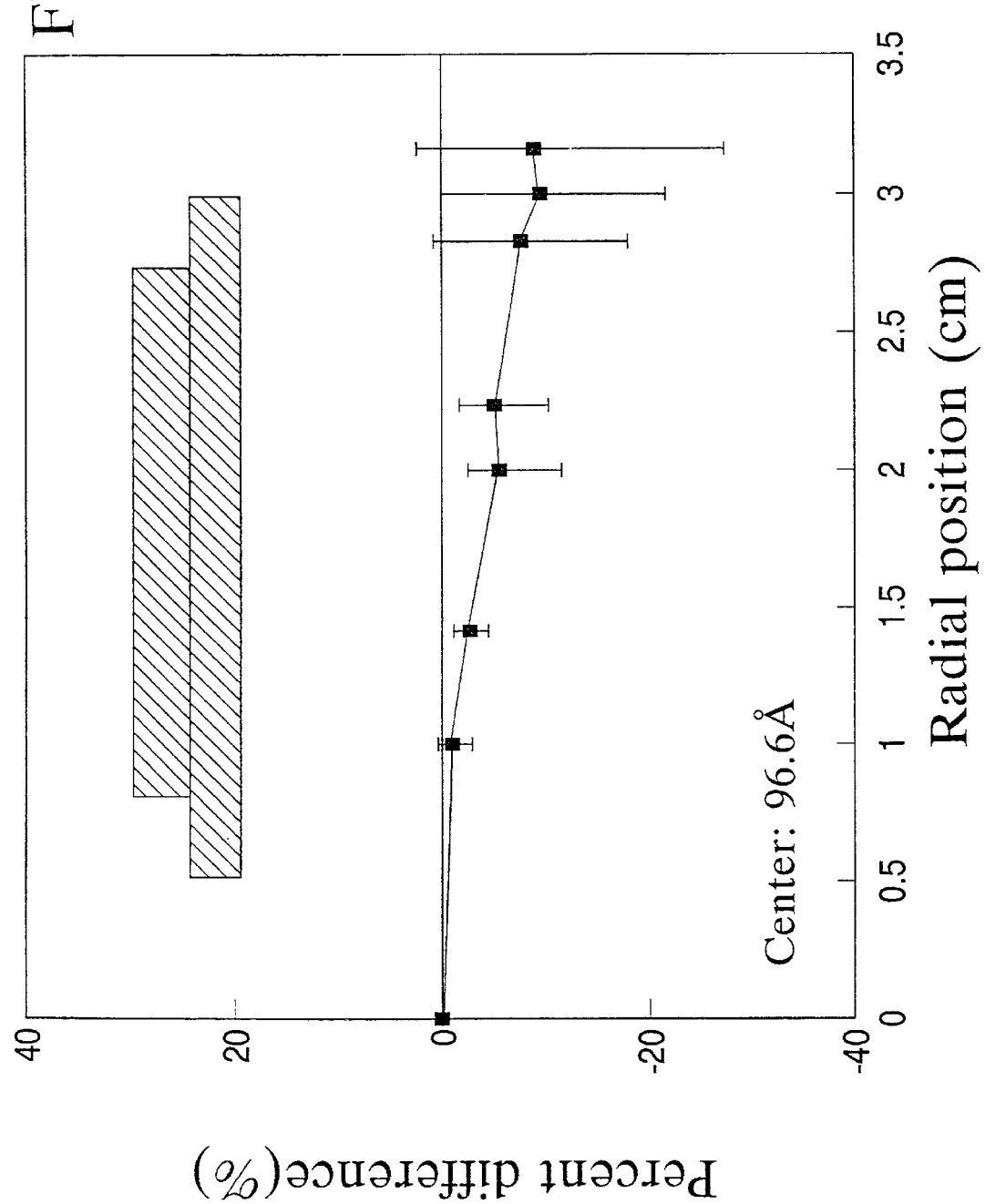

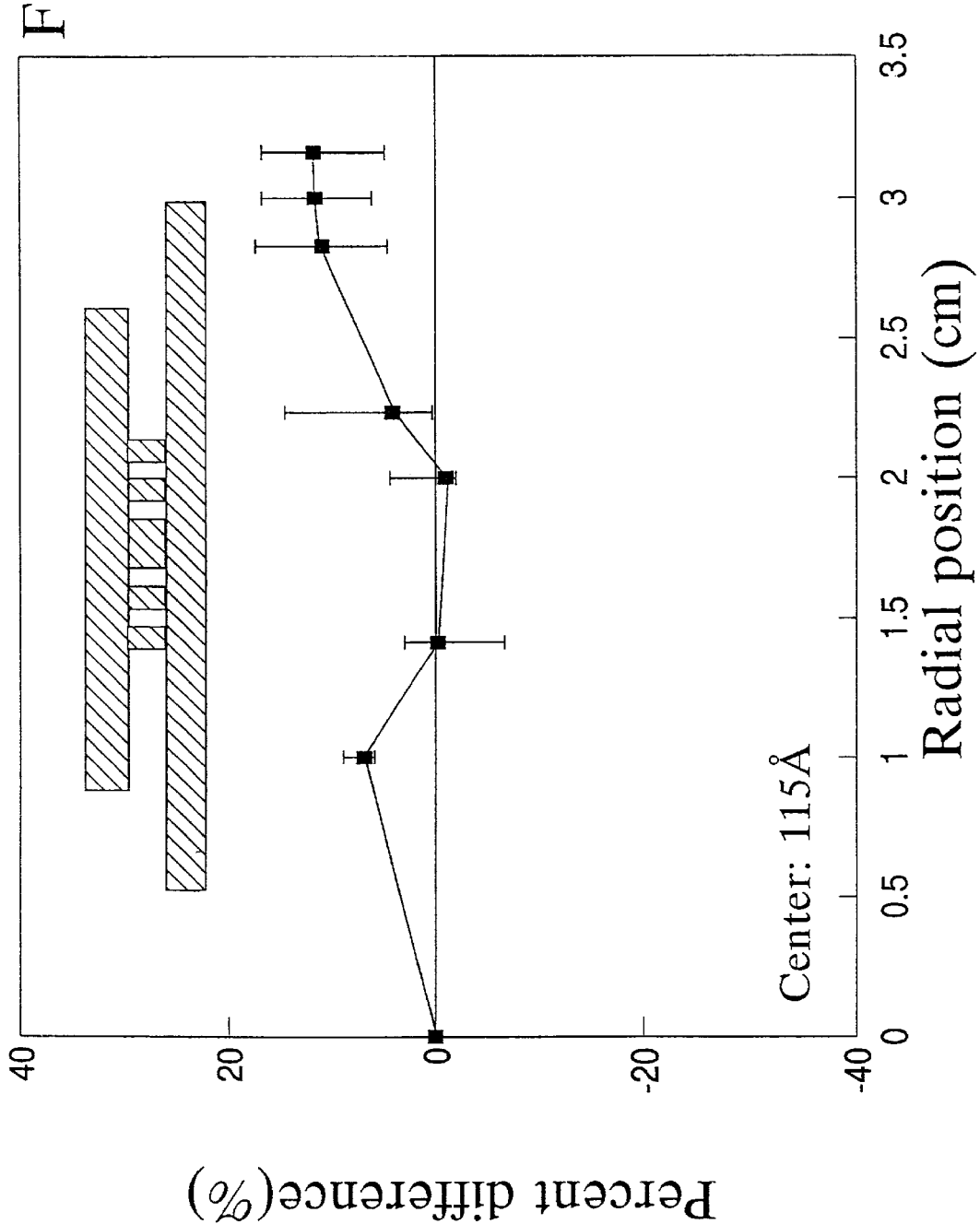

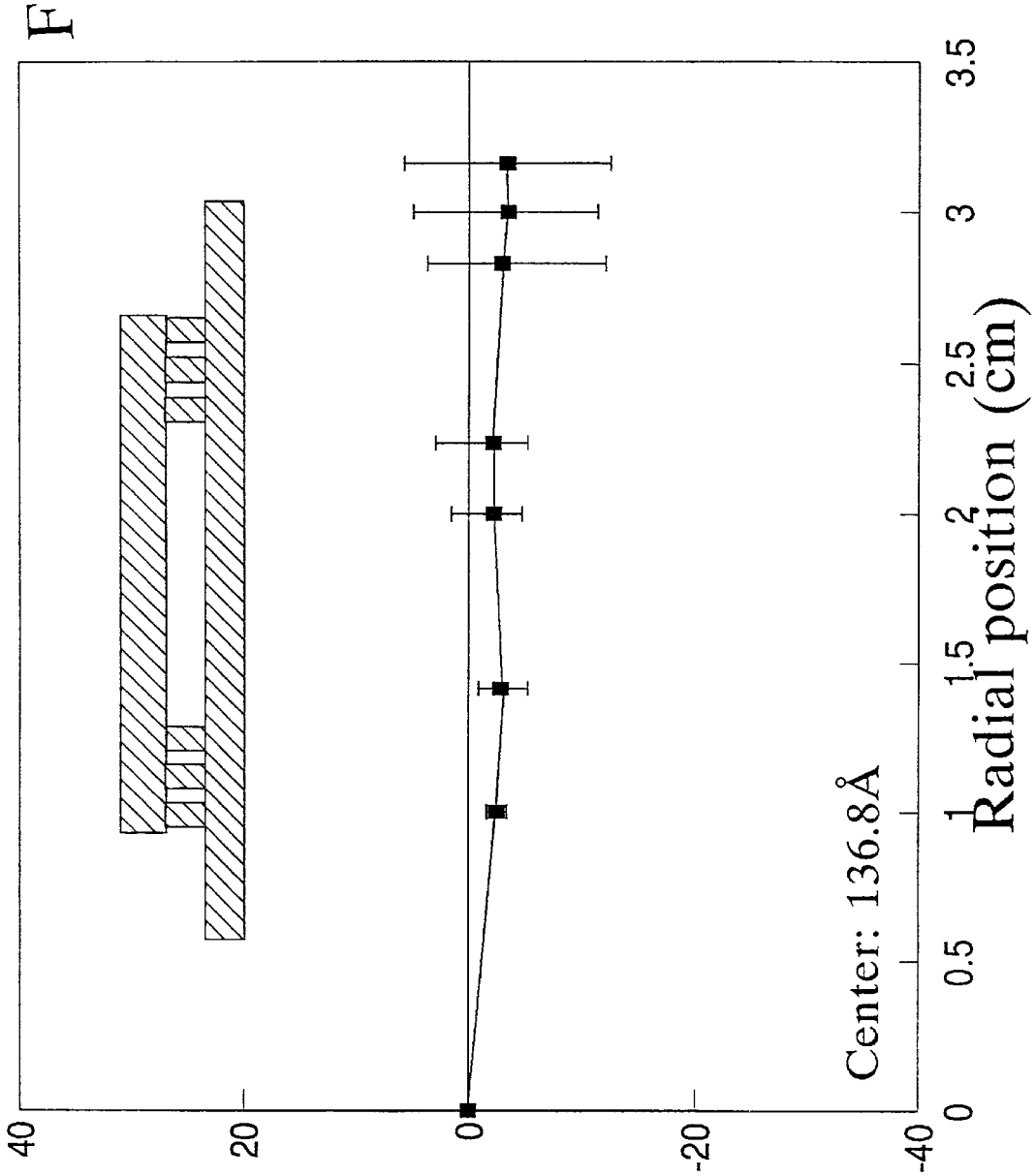

TEMPERATURE COMPENSATION METHOD FOR SEMICONDUCTOR WAFERS IN RAPID THERMAL PROCESSOR USING SEPARATED HEAT CONDUCTING RINGS AS SUSCEPTORS

BACKGROUND OF THE INVENTION

1. Field of the Invention

This invention concerns a new temperature compensation method for semiconductor wafers in rapid thermal processor. Its usage is simple and inexpensive. It also effectively changes the problem of uneven temperature distribution of the rapid thermal processor.

2. Cross-Reference to Related Applications

With advancement in electronics, the size of semiconductors is keep on going shrinking. The development of the technique in nano-meter-size components in ULSI (Ultra Large Scaled Integrated circuit) requires the progress of thickness of the oxygenated gate in the MOSFET towards 50 Angstrom. If the traditional high-temperature thermal growth method is used, a high quality in super-thin oxygenated layer is not possible. In order to obtain a high quality super-thin oxygenated layer, the key technique is to use Rapid Thermal Processing(RTP).

The traditional rapid thermal processing has the heating applied from a set of parallel halogen tube heating lights at the top of the system. Each light tube heats the wafer at the same heating output. It is a single sided heating system. However, the uneven temperature is the crucial problem faced by the traditional rapid thermal processors. The cause of the problem of uneven temperature is due to the following factors:

1. There are more radiation emitted by the surroundings of the wafers.
2. The inter-flow of cold air in the rapid thermal processing system keeps the surrounding of the wafer at a low temperatures.
3. The position of the halogen tube heating lights causes the central portion of the wafers to receive more light than the rim of the wafers.

Therefore, the temperature at the center of the wafer is higher than its rim. The difference is as much as 40% in actual cases.

3. Description of the Prior Art

In order to overcome the above problem, in 1989 R. Singh edited the International Society for Optical Engineering. In its $41^{st}$ page it raised a simple temperature compensation method. It utilize a large a silicon ring(larger than the wafer) to absorb the energy of the light in order to compensate for the temperature at the margin of the wafer. However, this sort of compensation could only be to a certain extent. The temperature at the center is still 15% greater than the margin of the wafer. B. J. Cho in the 1994 IEEE Trans. On Semicond. Manuf., 7th document 3rd issue at page 345 raised the issue of the specially designed optical geometric reflection so that the margin of the wafer could be heated by the reflected light. This solves the problem of uneven distribution of temperature. However, the geometric reflection designed for a certain temperature may not be suited for other temperature operations. B-J Cho and the rest, in 1995 K. C. Saraswat in Mat. Res. Symp. Proc. 387th issue at page 35 also raised the issue of adjustment of the position of the ultraviolet light and the active output of the light tube as a solution to the problem of uneven temperature of the wafer. But this method is comparatively more expensive and complicated. In addition, this method requires the entire alteration of the system of rapid thermal processor. The old system will be obsolete and this is a waste to those who owns the old systems. Other than this, according to P. Y. Wong and others in Mat. Res. Symp. Proc. 387th issue at page 15, if the surface of the chip has other material patterns carved on it, then the wafer itself, despite being placed in a rapid thermal processing system of even-temperature, will have uneven surface temperatures. There is no solution yet as to the uneven temperature caused by patterns on wafer surfaces.

Therefore, in order to more effectively solve the problem of uneven temperature of traditional rapid thermal processor, every rapid thermal processor should improve on the problem of the uneven temperature caused by the Pattern, in order to achieve their greatest capacity. The inventors of this invention used their unique knowledge on traditional rapid thermal processors and their professional knowledge on thermal conductivity to invent this simple, economic and effective solution of temperature compensation after continued laboratory experiment.

SUMMARY OF THE INVENTION

The purpose of this invention: In traditional rapid thermal processing system, due to the reason that thermal system heats up only one face of the wafer, the other unheated face of the platform must be the cooler portion. Today, we design a suitable heat conductor or thermal path so that the heat of the portion which received more thermal energy may be guided to is cooler areas. Through appropriate guidance of the thermal energy, the energy at the top of the wafer is used to achieve temperature compensation.

The other purpose of this invention is that an economic and simple solution to temperature compensation is used to greatly improve the problem of uneven temperature of the traditional rapid thermal processor.

There is one other purpose to this invention. A set of separate circular conductor ring design, through appropriate combination, is used as the platform on which to set the quartz wafer or silicon wafer. By placing the wafer to be processed on the platform, adjustment of different combinations radiuses of the conductor ring is used to achieve even distribution of temperature of the system which originally had uneven temperature distribution.

For those which are familiar with this skill, upon reading the different diagrams exhibiting the better demonstrating of the examples, will undoubtedly understand the purpose and the advantages of this design.

BRIEF DESCRIPTION OF THE DRAWINGS

FIGS. 3(a)–3(c): The effects of invention, being positioned on quartz platform with different combinations of silicon rings, towards the distribution of thickness of the super-thin oxygenated silicon layer.

FIG. 3(a): quartz RTO(30 sec)

FIG. 3(b): Si rings 1, 3, 4 on quartz susceptors

FIG. 3(c) Si rings 5, 6, 7 on quartz susceptors

FIGS. 4(a)–4(c): The effects of invention, being positioned on silicon platform with different combinations of silicon rings, towards the distribution of thickness of the super-thin oxygenated silicon layer.

FIG. 4(a): silicon susceptors

FIG. 4(b): Si rings 1, 3, 4 on silicon susceptors

FIG. 4(c): Si rings 5, 6, 7 on silicon susceptors

REFERENCE NUMBER OF THE ATTACHED DRAWINGS

Figure 1:
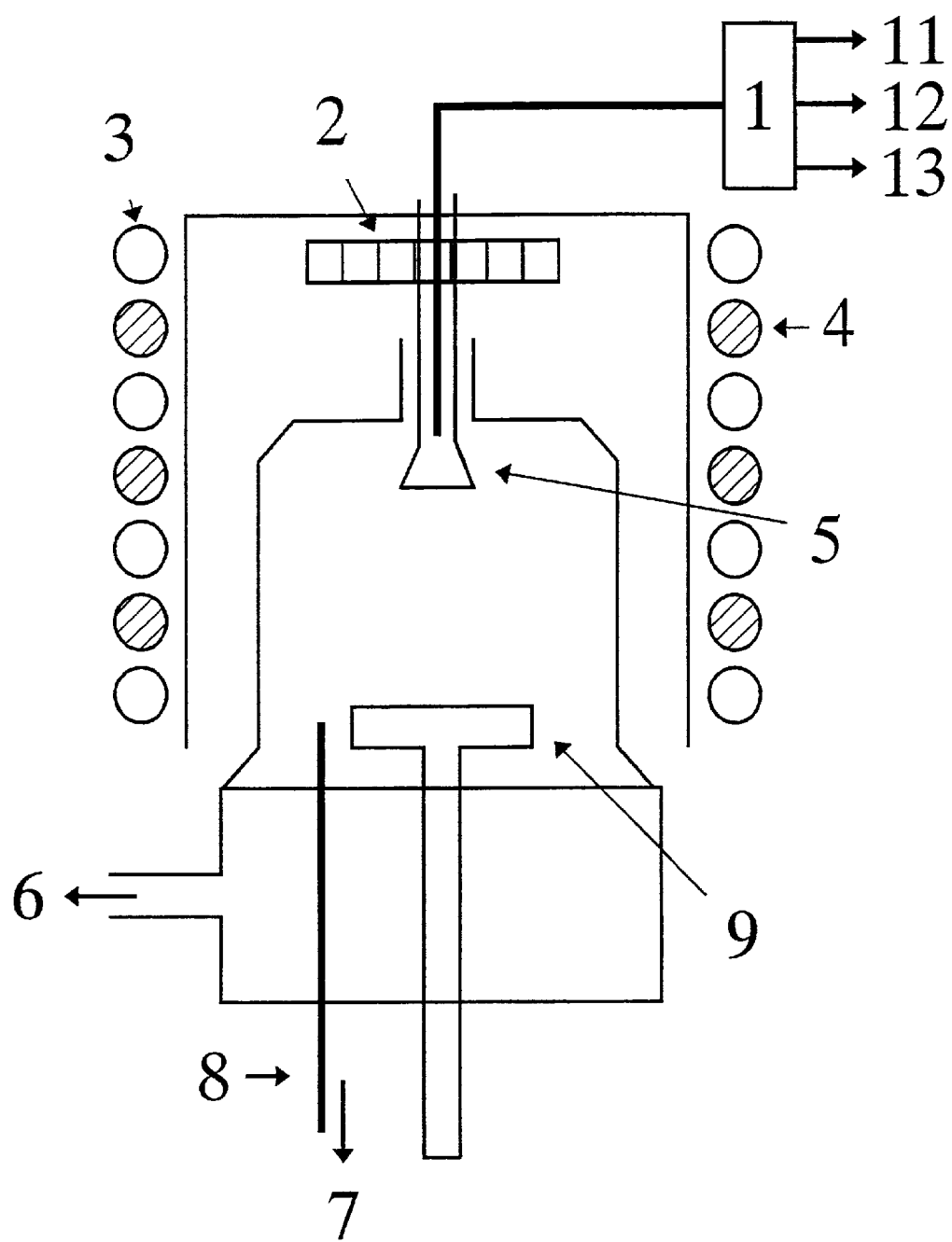
FIG. 1: The position of this invention in the traditional rapid thermal processing system.

1. Gate to control the amount of airflow
2. Halogen tube
3. Cold water tube
4. Cold air tube
5. Air spray mouthpiece
6. to Air pump
7. to Temperature controlling device
8. Thermal couple
9. Wafer support platform
91. 3-inch wafer
92. Silicon ring
11. Nitrogen gas
12. Nitrous oxide gas
13. Ammonia gas

DETAILED DESCRIPTION OF THE INVENTION

Now, let us use a better example of the structure of this temperature compensation method to describe the effect achievable with this invention.

The equipment used to manufacture this device is the traditional rapid thermal processor as shown in FIG. 1. The invention of a set of separate circular conductor ring design is positioned at the lower end of the rapid thermal processor while the heating lights at the top engage in single side heating of the wafer chip.

The technique used in this invention is "A suitable method for the temperature compensation of rapid thermal processing system". It uses the method of heat conductivity or heat radiation to guide the heat, through cushioned material, from the area of the heated wafer which is receiving more thermal energy to the area receiving less thermal energy. This achieves the purpose of even temperature compensation. As for the special requirements of certain pad material, these could be overcame by the combination of the pad material and the platform.

This invention has the technique of "A suitable method for the temperature compensation of rapid thermal processing system". One could also use the pad material which has the ability of temperature compensation by increasing its thickness and placing it at the bottom of the equipment of automatic lift. Computer is then used to perform a simulation of heat conductivity in control and analysis coordinated by equipment of automatic control. This way the level of heat received at the ring and matrix points could be gauged. Its operation could be combined with heat conducting system and heat radiation system so that the heat of the portion receiving more thermal energy could be passed to the area receiving less so that automation of the heat compensation system may be achieved.

The pad material of the technique "A suitable method for the temperature compensation of rapid thermal processing system" may be a circle, two dimensional matrix point or any geometric shape which is suited to the needs of the electronic system such as long slender form, triangular, quadrangle, pentagon or hexagon. Its size is also changeable according to the needs of the electronic system and its not limited. The material of the pad or the platform may be quartz, SiC or others which posses resistance to high temperatures.

Figure 2:
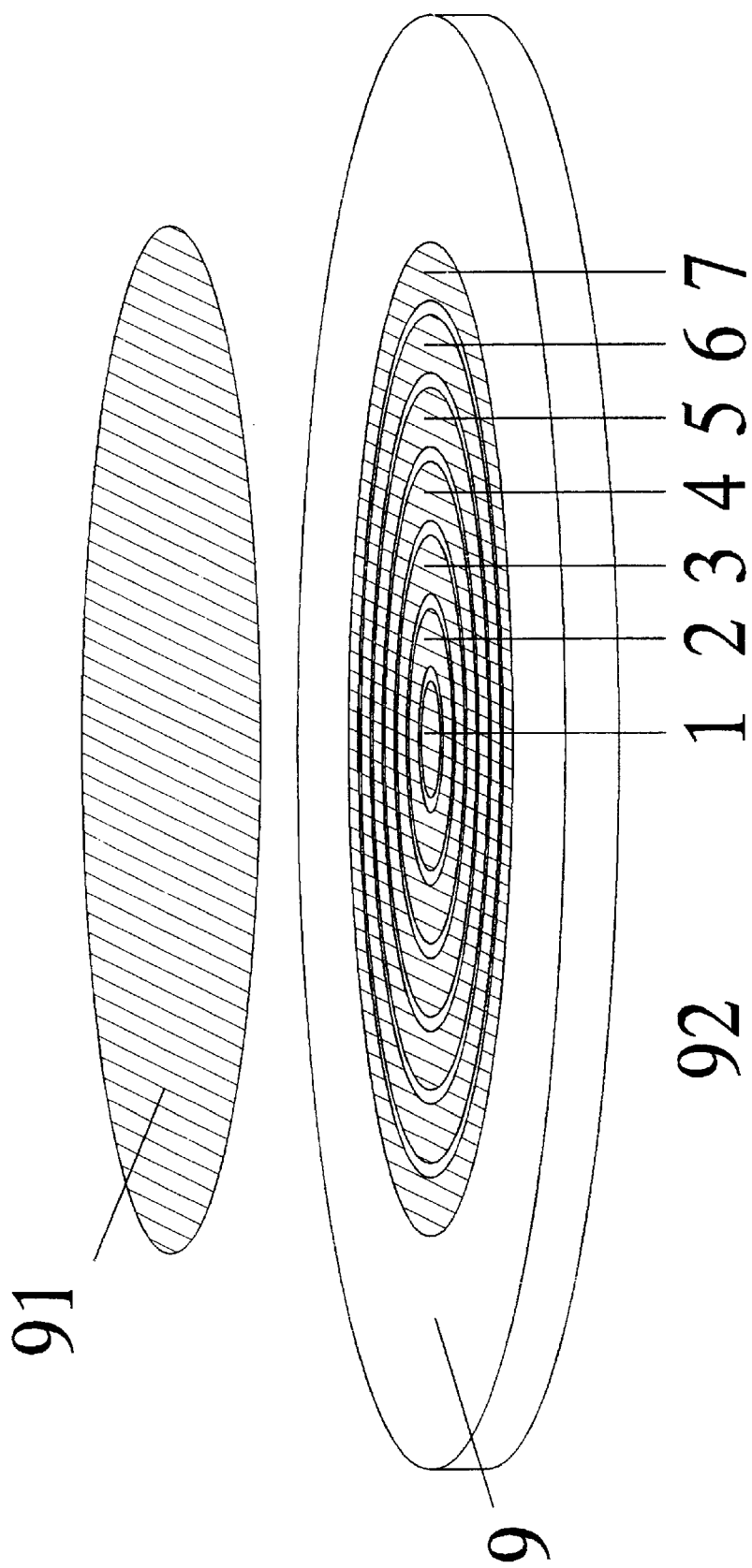
FIG. 2: A better description of the design's implementation.

As shown in FIG. 2, these pads are formed by the chemical etching of wafer into rings having the same center. The thickness of each silicon ring 300 um, width 4 mm or 9 mm. The distance between rings is 1 mm. By tagging these silicon rings with numbers from 1 to 7 as shown in FIG. 2 and then placing them in appropriate combination on the quartz platform or silicon platform, we can then position the to-be-processed wafers on the silicon rings to have them heated by the heating light at one single face. If the platform is of quartz, since quartz is a heat insulation material, the heat at the bottom of the wafer could not dissipate. Therefore the method for dissipating heat is through the means of heat radiation. At this time, the function of the silicon ring is to obstruct heat radiation. The portion which has the rings do not have heat so easily dissipated. If the platform is of silicon, since the platform is at the bottom of the wafer, it did not receive direct heating of the lights. Therefore, its temperature at the bottom is lower as compared to the top of the wafer. Therefore, with the conductivity of the silicon rings, thermal energy is transmitted from the hotter silicon wafer to the cooler silicon platform. In addition, the wafer itself will re-distribute its own temperature due to its characteristic of heat conductivity. Therefore, if the position of the silicon rings could be adjusted so that the hotter central portions could have its extra thermal energy conducted or radiated to the bottom and considering the characteristic of heat conductivity of the silicon wafer itself, the temperature difference could be compensated to 5% or less in the area between the central portion of the silicon wafer and its margins. However, this depends on the accuracy of the adjustment in the silicon rings.

Figure 3A:
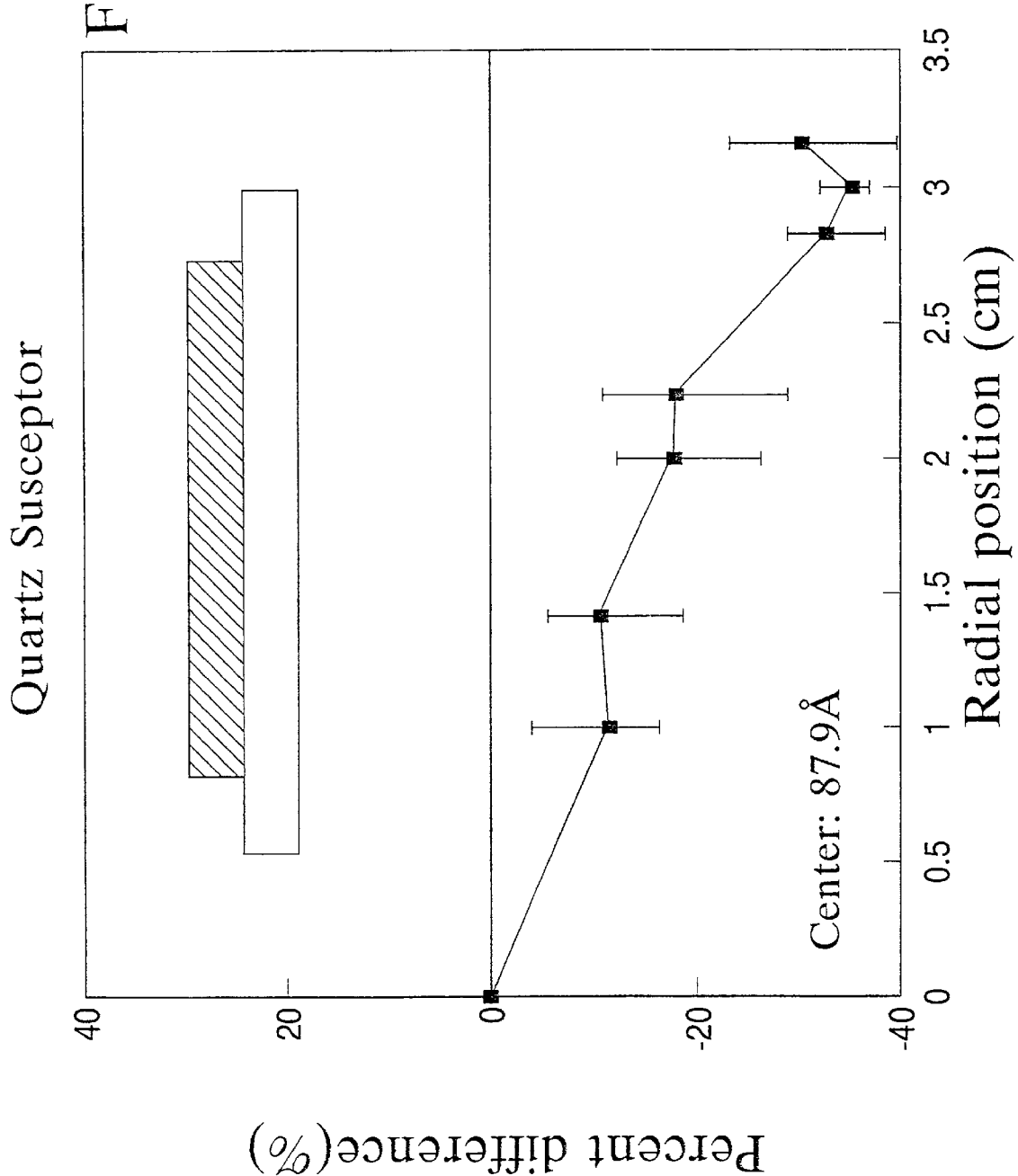

As shown in FIGS. 3 & 4, if different arrangement of silicon rings are positioned on the quartz and silicon platform, then there are different effects as to the distribution of the super-thin oxygenated silicon layer. The tag number of the arranged silicon rings is shown in FIGS. 3 & 4. The oxygenated silicon layer of FIGS. 3 rd and 4 th has its condition of oxygenation as requiring the usage of 3-inch P type (100) silicon wafer at 960 degrees Celsius under 500 torr pressure of oxygen for a period of 30 seconds in growth with no rotation of the platform during the growth. From FIGS. 3 & 4, we found that whether silicon or quartz platform is used for growth, appropriate combination of silicon rings could greatly improve the distribution of thickness of oxygenated layers. The better combination of rings is the one in FIGS. 3(c) and 4(c). The ring combination is ring 5, 6 and 7. In addition, the use of silicon platform could achieve a thicker and more evenly distributed oxygenated layer. This is due to the reason that the silicon platform had obstructed the heat radiation from the bottom. The rim of the silicon platform is also heated by the light energy so that the margin of the silicon wafer also receives more heat energy. As for quartz platform, since it is transparent, it is not so easily heated by light energy. Heat radiation energy dissipate from the bottom of the silicon wafer. Besides, the margin of the silicon wafer also did not receive heat energy from the quart platform so the thickness of the oxygenated layer grown through the use of the silicon platform is better than quartz platform in being more evenly distributed.

This new form of temperature compensation, irrelevant of the thickness of the silicon rings, irrelevant of the initial temperature distribution of the system and irrelevant of the material of the platform being quartz or silicon, as long as the combination of silicon rings are appropriately adjusted, it could achieve an even temperature distribution of the wafer to be processed. If growth with rotation could be coordinated, the temperature distribution will be even better.

This method of temperature compensation used a very simple solution to improve greatly on the problem of uneven temperature distribution in traditional rapid temperature processing system. As for the uneven distribution caused by Pattern, improvements are also possible through such means. Its practicality and innovation are full of industrial and commercial value.

Silicon rings may also be replaced by other materials such as quartz or SiC. In addition, the choice of silicon ring combination, if designed to be interchangeable at the switch of a button, its usage will be much more convenient.

From the content described previously, one could understand the advantages of the invention:

In view of the above, it is but one example of the actual usage of this invention it does not limit the scope of implementation of this invention. Those altered usage which are of the same effect and which are under the spirit and principal of this invention should all be included within the scope of the patent of this invention.

What is claimed is:

1. A temperature compensation system in a rapid thermal processing system that provides thermal energy to a wafer having a first portion and a second portion, in which said first portion of said wafer receives a greater quantity of said thermal energy than said second portion of said wafer, said temperature compensation system comprising:

a plurality of thermally conductive geometric pad elements spaced from one another, said plurality of thermally conductive geometric pad elements cooperating to guide said thermal energy from said first portion of said wafer to said second portion of said wafer thereby moderating a temperature gradient of said first and second portions of said wafer.

2. The temperature compensation system as recited in claim 1 wherein said plurality of thermally conductive geometric pad elements comprise thermally conductive concentric rings.

3. The temperature compensation system as recited in claim 1 wherein said plurality of thermally conductive geometric pad elements are formed from materials selected from the group consisting of silicon, quartz and silicon carbide.

4. The temperature compensation system as recited in claim 1 wherein a configuration of said plurality of thermally conductive geometric pad elements is selected from the group consisting of a linear pattern, a triangular pattern, a rectangular pattern, a pentagonal pattern and a hexagonal pattern.

* * * * *